(12) United States Patent
Song et al.

(10) Patent No.: US 6,741,508 B2
(45) Date of Patent: May 25, 2004

(54) SENSE AMPLIFIER DRIVER CIRCUITS CONFIGURED TO TRACK CHANGES IN MEMORY CELL PASS TRANSISTOR CHARACTERISTICS

(75) Inventors: Tae-joong Song, Kyungki-do (KR); Eun-kyoung Lim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/336,524

(22) Filed: Jan. 3, 2003

(65) Prior Publication Data

US 2003/0128608 A1 Jul. 10, 2003

(30) Foreign Application Priority Data

Jan. 9, 2002 (KR) .................................. 2002-0001246

(51) Int. Cl.[7] ................................................ G11C 7/00
(52) U.S. Cl. ........................ 365/196; 365/205; 365/194
(58) Field of Search ................................ 365/196, 205, 365/194

(56) References Cited

U.S. PATENT DOCUMENTS 6,009,030 A * 12/1999 Seo ............................ 365/205
6,320,794 B1 * 11/2001 Kang et al. ............. 365/189.02
6,385,101 B1 * 5/2002 Chang et al. ................ 365/196

* cited by examiner

Primary Examiner—Huan Hoang
(74) Attorney, Agent, or Firm—Myers Bigel Sibley & Sajovec

(57) ABSTRACT

A sense amplifier driver circuit for generating a sense amplifier enable signal that enables a sense amplifier that drives a bit line coupled to a pass transistor of a memory cell includes an inverter that generates the sense amplifier enable signal, the inverter comprising a plurality of series-connected MOS transistors of the same conductivity type as the pass transistor. The plurality of series-connected MOS transistors may have an overall channel width/length ratio that is substantially the same as a channel width/length ratio of the pass transistor. The aggregate length of the series-connected transistors may be substantially the same as a length of the pass transistor, and widths of the series-connected transistors may be different from a width of the pass transistor.

29 Claims, 8 Drawing Sheets

FIG. 7 (PRIOR ART)

| CONDITION | OPERATING VOLTAGE | TEMPERATURE | PROCESS ||
| --- | --- | --- | --- | --- |
| | | | NMOS | PMOS |
| 1 | HIGH | LOW | FAST | FAST |
| 2 | HIGH | LOW | FAST | SLOW |
| 3 | HIGH | LOW | SLOW | FAST |
| 4 | HIGH | LOW | SLOW | SLOW |
| 5 | HIGH | HIGH | FAST | FAST |
| 6 | HIGH | HIGH | FAST | SLOW |
| 7 | HIGH | HIGH | SLOW | FAST |
| 8 | HIGH | HIGH | SLOW | SLOW |
| 9 | LOW | LOW | FAST | FAST |
| 10 | LOW | LOW | FAST | SLOW |
| 11 | LOW | LOW | SLOW | FAST |
| 12 | LOW | LOW | SLOW | SLOW |
| 13 | LOW | HIGH | FAST | FAST |
| 14 | LOW | HIGH | FAST | SLOW |
| 15 | LOW | HIGH | SLOW | FAST |
| 16 | LOW | HIGH | SLOW | SLOW |

SENSE AMPLIFIER DRIVER CIRCUITS CONFIGURED TO TRACK CHANGES IN MEMORY CELL PASS TRANSISTOR CHARACTERISTICS

RELATED APPLICATION

This application claims priority to Korean Patent Application 2002-0001246, filed on Jan. 9, 2002, the contents of which are herein incorporated by reference in their entirety.

BACKGROUND OF THE INVENTION

The present invention relates to semiconductor memory devices, and more particularly, to sense amplifier driver circuits for semiconductor memory devices.

A typical semiconductor memory device has a plurality of bit cells, such as memory cells, and a plurality of sense amplifiers for sensing and amplifying data through bit lines which are connected to the bit cells in a read operation. The sense amplifiers are driven by a sense amplifier driver circuit that receives external clock signals and generates a sense amplifier-driving signal.

FIG. 1 illustrates a portion of a static random access memory (SRAM), and FIG. 2 illustrates waveforms for a read operation of the SRAM. Referring to FIG. 1, an SRAM bit cell 11 includes NMOS pass transistors N13 and N14 and a latch 111 having PMOS transistors P11 and P12 and NMOS transistors N11 and N12. Referring to FIG. 2, when a word line WL is activated into a logic high state, the NMOS pass transistors N13 and N14 are turned on so as to develop data, which is stored in the latch 111 of the bit cell, through bit lines BL and BLB. A sense amplifier 13 senses and amplifies the data through the bit lines BL and BLB in response to a sense amplifier-driving signal SAEN, which is generated by a sense amplifier driver circuit 15.

In order to stably perform the sensing operation of the sense amplifier 13, the sense amplifier driving signal SAEN is typically activated after sufficiently developing the data stored in the latch 111 of the bit cell through the bit lines BL and BLB. A period from the activation of the word line WL to the development of the data stored in the latch 111 to a predetermined valid level on the bit lines BL and BLB, is referred to as Tbit. A period from the activation of the word line WL, i.e., the activation of an internal clock signal ICK input to the sense amplifier driver circuit 15, to the activation of the sense amplifier driver circuit 15 is referred to as Td. It is preferable that the period Td is the same as or slightly longer than the period Tbit. The internal clock signal ICK is generated from an external clock signal.

When the period Td is shorter than the period Tbit, an unstable sensing operation of the sense amplifier 13 may occur. When the period Td is excessively longer than the period Tbit, the speed of the sensing operation may be lowered. Consequently, it is preferable that the period Td is slightly longer than the period Tbit, and it is more preferable that the period Td is the same as the period Tbit. Accordingly, in designing an SRAM semiconductor device, it is desirable that the period Tbit be precisely estimated, and the sense amplifier driver circuit 15 designed to generate the period Td such that it is the same as or slightly longer than the period Tbit.

The period Tbit may be affected by various factors, especially by an RC delay due to a parasitic capacitance and parasitic resistance of the bit lines BL and BLB, and by the characteristics of the pass transistors N13 and N14 that drive the bit lines BL and BLB. The parasitic capacitance and parasitic resistance of the bit lines BL and BLB, and the characteristics of the pass transistors N13 and N14 typically vary according to manufacturing process, operating voltage, and temperature. Consequently, the period Tbit typically varies according to the manufacturing process, the operating voltage, and the temperature.

FIG. 3 is a circuit diagram illustrating the sense amplifier driver circuit shown in FIG. 1. The sense amplifier driver circuit 15 includes a plurality of delay inverters 31, 33, 35, and 37 that are connected in series. In FIG. 3, although four delay inverters are shown, the sense amplifier driver circuit 15 may include an even number of delay inverters other than four. The delay inverters 31, 33, 35, and 37 delay and invert an internal clock signal ICK.

The internal clock signal ICK is input through the input of the first delay inverter 31, and the sense amplifier driving signal SAEN, formed by delaying the internal clock signal ICK for the period Td (the sum of delay periods of the delay inverters), is output from the output of the last delay inverter 37. The internal clock signal ICK is generated from an external clock signal.

FIG. 4 illustrates a conventional implementation of the delay inverters shown in FIG. 3, and FIG. 5 illustrates another conventional implementation of the delay inverters shown in FIG. 3. The conventional circuit in FIG. 4 includes a PMOS transistor P41, an NMOS transistor N41, an RC delay element formed by capacitances C41 and C42 and resistances R41 and R42, and a fuse F41 for varying a delay period. The conventional delay inverter shown in FIG. 5 includes a PMOS transistor P51 and an NMOS transistor N51 having a small beta ratio β, where the beta ratio β is a ratio of width to length.

A frequent problem with the delay inverters shown in FIGS. 4 and 5 is that the change in the period Td may or may not track the change in the period Tbit, depending on the manufacturing process, the operating voltage, and the temperature. When the manufacturing process, the operating voltage, and the temperature vary, the variation of the period Tbit may be larger than the variation of the period Td, so that the period Td may become shorter than, or excessively longer than, the period Tbit. Consequently, the sensing operation of the sense amplifier 13 may be unstable or the speed of the sensing operation may undesirably decrease.

FIG. 6 is a graph of simulation results showing the periods Td and Tbit in an SRAM having a conventional sense amplifier driver circuit as shown in FIG. 4. FIG. 7 is a table illustrating various working conditions corresponding to various combinations of manufacturing process, operating voltage, and temperature used for the simulation of FIG. 6. In FIG. 7, HIGH operating voltage refers to 1.35 V, LOW operating voltage refers to 1.05 V, LOW temperature refers to −55° C., HIGH temperature refers to 125° C., FAST process refers to a fast process parameter for a 0.13 um CMOS process, and SLOW process refers to a slow process parameter for a 0.13 um CMOS process.

Referring to FIG. 6, the periods Td and Tbit are significantly different except for the working condition 11. In particular, the period Td is excessively longer than the period Tbit for the working condition 16, in which the performance of the SRAM is the worst of the illustrated cases. In this case, the sensing speed of the sense amplifier 13 undesirably decreases, which can degrade the performance of the SRAM.

In an SRAM having a conventional sense amplifier driver circuit, the RC delay elements of the bit lines BL and BLB shown in FIG. 1 and of the delay inverters shown in FIG. 4 and the driving performances of the pass transistors N13 and N14 shown in FIG. 1 and of the delay inverters shown in FIG. 4 generally have different characteristics according to the working conditions. Accordingly, the period Tbit typically does not closely track the change in the period Td in response to variations of process, operating voltage, and temperature.

SUMMARY OF THE INVENTION

In some embodiments of the present invention, a sense amplifier driver circuit of an SRAM includes a plurality of delay inverters connected in series, wherein at least one delay inverter includes a plurality of NMOS transistors connected to an output in series while having gates connected to an input, and the overall beta ratio (a ratio of width to an entire length of the NMOS transistors) of the NMOS transistors is the same as the beta ratio of a pass transistor in the bit cell. It is preferable that the length of the NMOS transistors is substantially the same as the length of the pass transistor in the bit cell and that the width of the NMOS transistors is different from the width of the pass transistor in the bit cell.

In further embodiments of the present invention, a sense amplifier driver circuit of SRAM includes a plurality of delay inverters connected in series, wherein at least one delay inverter has a plurality of NMOS transistors connected to an output in series while having gates connected to an input. A plurality of PMOS transistors is connected to the output in parallel while having gates connected to the input. The overall beta ratio of the NMOS transistors is substantially the same as the beta ratio of a pass transistor in the bit cell. It is preferable that the length of the NMOS transistors is substantially the same as the length of the pass transistor in the bit cell and that the width of the NMOS transistors is different from the width of the pass transistor in the bit cell.

According to still further embodiments of the present invention, a sense amplifier driver circuit of SRAM includes a plurality of delay inverters connected in series, wherein at least one delay inverter has a plurality of NMOS transistors connected to an output in series while having gates connected to an input, and a plurality of PMOS transistors connected to the output in series while having gates connected to the input, wherein the overall beta ratio of the NMOS transistors is the same as the beta ratio of a pass transistor in the bit cell. It is preferable that the length of the NMOS transistors is substantially the same as the length of the pass transistor in the bit cell and that the width of the NMOS transistors is different from the width of the pass transistor in the bit cell.

In further embodiments of the invention, a sense amplifier driver circuit for generating a sense amplifier enable signal that enables a sense amplifier that drives a bit line coupled to a pass transistor of a memory cell includes an inverter that generates the sense amplifier enable signal. The inverter includes a pull-down circuit including a plurality of series-connected MOS transistors of the same conductivity type as the pass transistor. The plurality of series-connected MOS transistors may have an overall channel width/length ratio that is substantially the same as a channel width/length ratio of the pass transistor. The aggregate length of the series-connected transistors may be substantially the same as a length of the pass transistor, and widths of the series-connected transistors may be different from a width of the pass transistor.

In some embodiments, the inverter comprises at least one PMOS transistor having a source electrode coupled to a first power supply node, and a series-connected plurality of NMOS transistors coupled between a drain electrode of the at least one PMOS transistor and a second power supply node. Gate electrodes of the at least one PMOS transistor and the NMOS transistors are commonly connected. The inverter may further comprise a fuse connected in parallel with at least one of the series-connected NMOS transistors.

In further embodiments, the inverter comprises a PMOS transistor having a source electrode coupled to a first power supply node, and a series-connected plurality of NMOS transistors coupled between a drain electrode of the PMOS transistor and a second power supply node. Gate electrodes of the PMOS transistor and the NMOS transistors are commonly connected.

In still further embodiments, the inverter comprises a plurality of PMOS transistors having source electrodes coupled in common to a first power supply node and a series-connected plurality of NMOS transistors coupled between commonly connected drain electrodes of the PMOS transistors and a second power supply node. Gate electrodes of the PMOS transistors and the NMOS transistors are commonly connected.

In additional embodiments, the inverter comprises a series-connected plurality of PMOS transistors having a source electrode coupled to a first power supply node, and a series-connected plurality of NMOS transistors coupled between a drain electrode of the series-connected PMOS transistors and a second power supply node. Gate electrodes of the PMOS transistors and the NMOS transistors are commonly connected.

BRIEF DESCRIPTION OF THE DRAWINGS

FIG. 7 illustrates various working conditions characterized by various combinations of manufacturing process, operating voltage, and temperature corresponding to the simulation results of FIG. 6.

DETAILED DESCRIPTION

Figure 1:
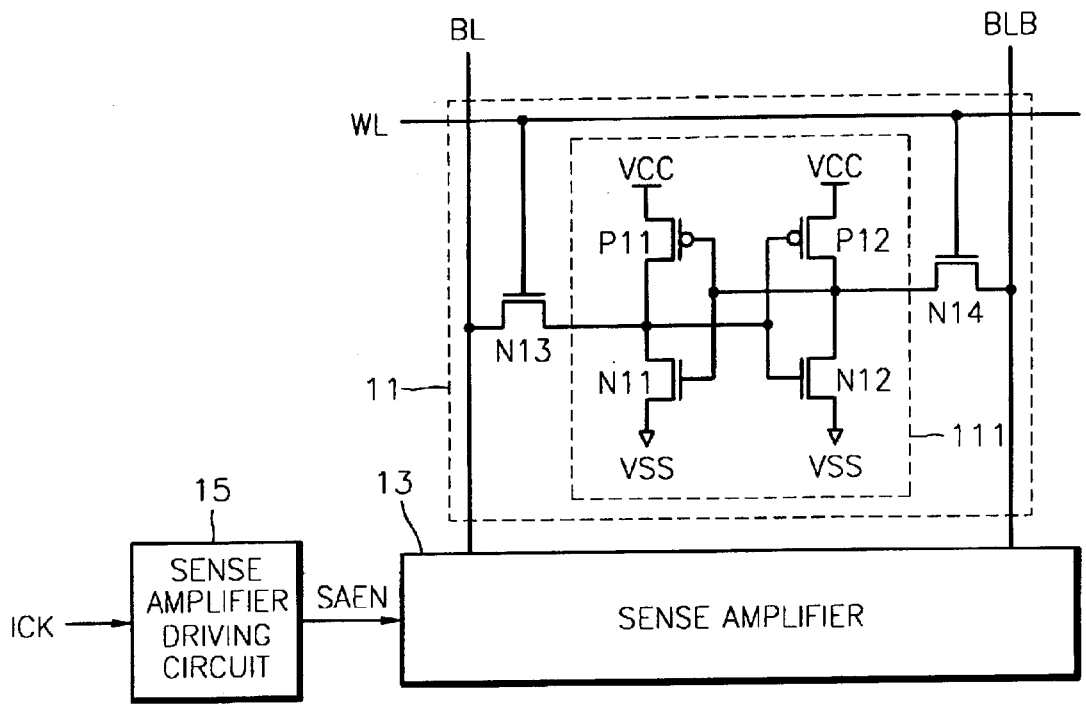
FIG. 1 illustrates portions of a conventional SRAM.
Figure 2:
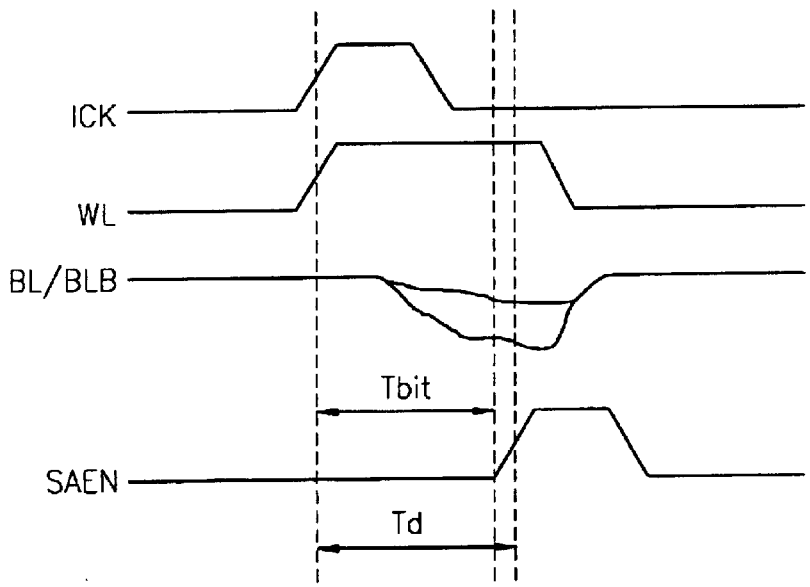
FIG. 2 illustrates exemplary waveforms of signals in a read operation of the SRAM shown in FIG. 1.
Figure 3:
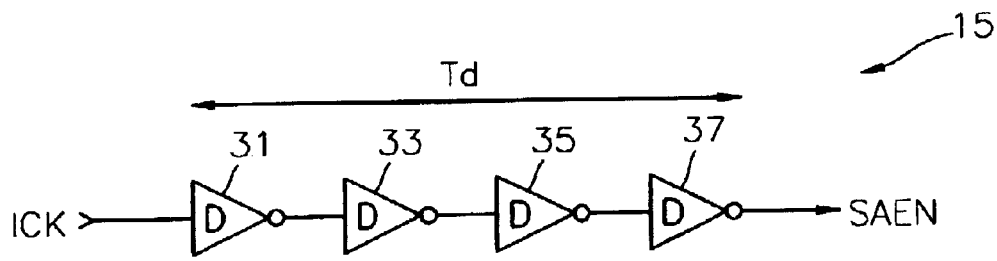
FIG. 3 is a circuit diagram of a conventional sense amplifier driver circuit.
Figure 4:
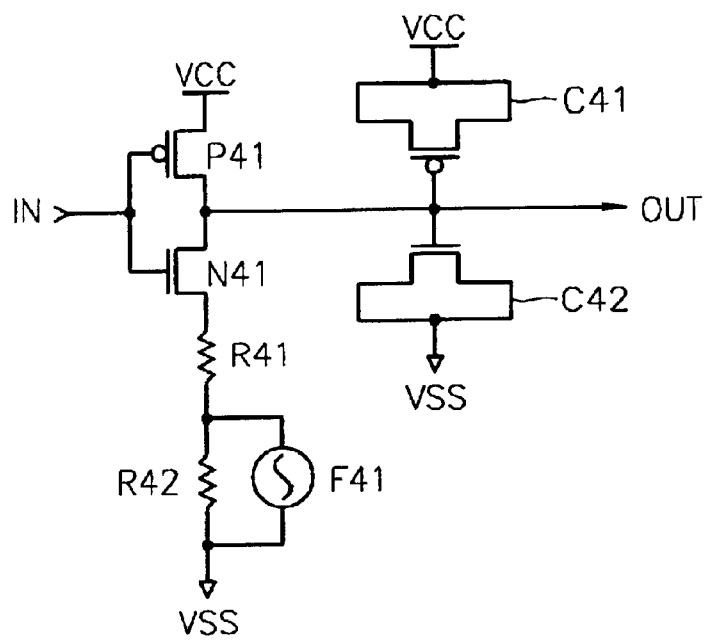
FIG. 4 is a circuit diagram of a conventional configuration for the delay inverters of the sense amplifier driver circuit of FIG. 3.
Figure 5:
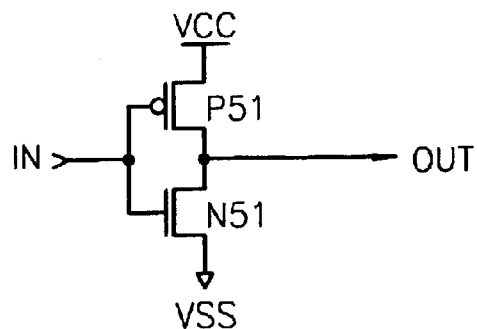
FIG. 5 is a circuit diagram of another conventional configuration for the delay inverters of the sense amplifier driver circuit of FIG. 3.
Figure 6:
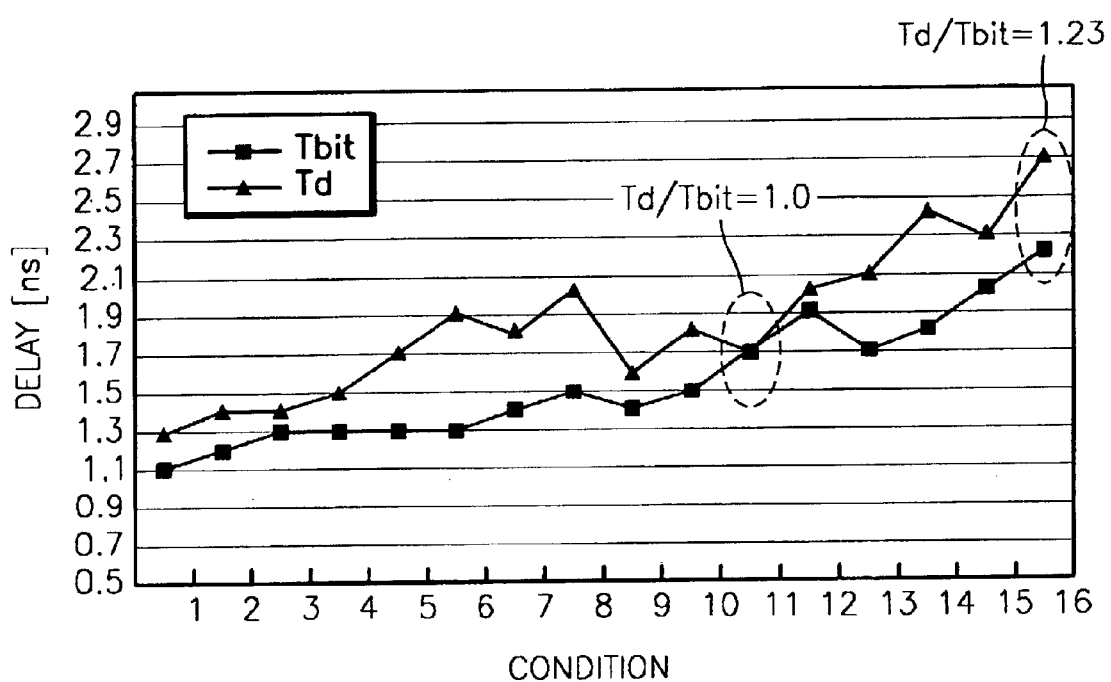
FIG. 6 is a graph of simulation results illustrating period Td and period Tbit in a conventional SRAM having the sense amplifier driver circuit inverter configuration shown in FIG. 4.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

Figure 8:
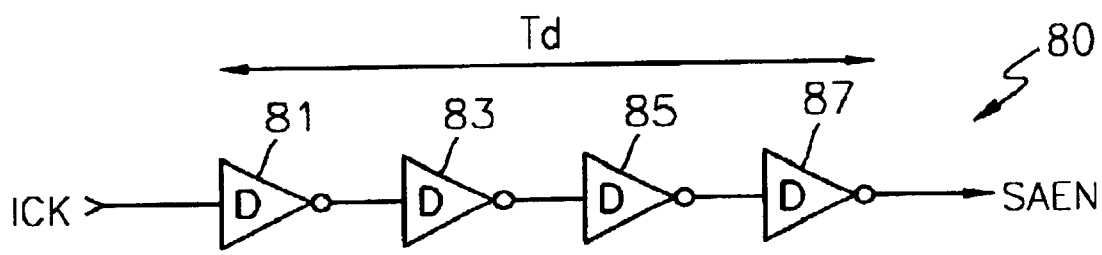
FIG. 8 is a circuit diagram of a sense amplifier driver circuit according to some embodiments of the present invention.

FIG. 8 is a circuit diagram of a sense amplifier driver circuit 80 for an SRAM according to some embodiments of the present invention. The sense amplifier driver circuit 80 includes a plurality of delay inverters 81, 83, 85, and 87 that are connected in series. In FIG. 8, four delay inverters are shown; however, the sense amplifier driver circuit may include even numbers of delay inverters other than four. An internal clock signal ICK, generated from an external clock signal, is input through the input of the first delay inverter 81. A sense amplifier-driving signal SAEN is generated by delaying the internal clock signal ICK for a period Td (the sum of delay periods of the delay inverters) and is output from the output of the last delay inverter 87.

Figure 9:
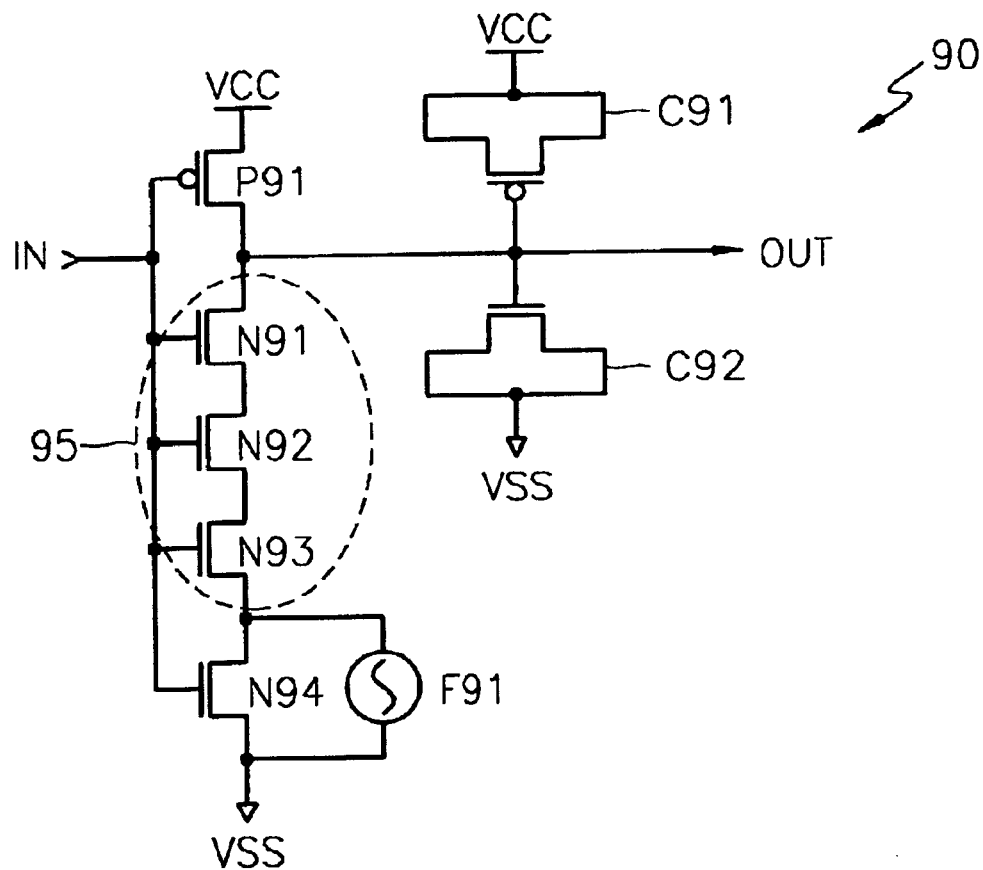
FIG. 9 illustrates a configuration of delay inverters for the sense amplifier driver circuit of FIG. 8 according to some embodiments of the present invention.

Referring to FIG. 9, a delay inverter 90 according to some embodiments of the present invention includes a pull-down circuit 95 including series-connected NMOS transistors N91 through N94, a PMOS transistor P91, capacitances C91 and C92, and a fuse F91. The NMOS transistors N92 through N94 are connected in series between an output OUT and a ground voltage VSS, and the gates of the NMOS transistors N92 through N94 are connected to an input IN. The PMOS transistor P91 is connected between the output OUT and a source voltage VCC, and the gate of the PMOS transistor P91 is connected to the input IN.

The capacitance C91 is formed from PMOS transistors whose source and drain are connected to the source voltage VCC, and is connected between the output OUT and the source voltage VCC. The capacitance C92 is formed from an NMOS transistor whose source and drain are connected to the ground voltage VSS, and is connected between the output OUT and the ground voltage VSS. The fuse F91 connected to the NMOS transistor N94 in parallel can be used to vary the delay period of the delay inverter.

An overall beta ratio, i.e., a ratio of width to an aggregate length of the NMOS transistors N91 through N93 is the same as the beta ratio of a pass transistor in a bit cell, e.g., pass transistors N13 and N14 shown in FIG. 1. In other words, the overall beta ratio of the NMOS transistors N91 through N93 is the same as the beta ratio of the pass transistor in the bit cell for the period Td to track the change of a period Tbit according to variations in a manufacturing process, operating voltage, and temperature. It is preferable that the aggregate length of the NMOS transistors N91 through N93 is substantially the same as the length of the pass transistor N13 or N14 shown in FIG. 1 of the bit cell, and that the width of the NMOS transistors N91 through N93 is different from the width of the pass transistors of the bit cell.

As described above, the period Tbit before a bit line voltage becomes valid may be affected by characteristics of the pass transistor used in the cell (e.g., N13 or N14 shown in FIG. 1). Because the pass transistor is typically embedded in the bit cell, the width of the pass transistor typically is very narrow, e.g., much narrower than the minimum width of transistors used in peripheral circuit blocks. Consequently, to equal the beta ratio of the NMOS transistors N91 through N93 of the sense amplifier driver circuitry of FIG. 9 to the beta ratio of the pass transistors, it is preferable that the aggregate length of the NMOS transistors N91 through N93 is the same as that of the pass transistor, and the widths of the NMOS transistors N91 through N93 are different from that of the pass transistor.

$$\beta = W/L \tag{1}$$

$$\beta = 0.16 \text{ um}/0.13 \text{ um} = 1.23 \tag{2}$$

$$\beta = 0.16 \text{ ums } 3/0.13 \text{ ums } 3 = 0.48 \text{ um}/0.39 \text{ um} = 1.23 \tag{3}$$

$$\beta = (0.48 \text{ um}/0.13 \text{ um})/3 = 1.23 \tag{4}$$

Equation 1 calculates the beta ratio $\beta$ of the MOS transistor. Referring to Equation 2, when the width of the transistor is 0.16 um and the length of the transistor is 0.13 um, the beta ratio $\beta$ becomes 1.23. Referring to Equation 3, when the width of the MOS transistor is 0.48 um, the length of the MOS transistor has to be 0.39 um for the beta ratio $\beta$ to be 1.23. Referring to Equation 4, when three transistors are connected in series and the width of the transistors is 0.48 um, the length of the transistors has to be 0.13 um for the beta ratio $\beta$ to be 1.23.

Consequently, when the width and length of the pass transistor N13 or N14 shown in FIG. 1 of the bit cell are 0.16 um and 0.13 um, respectively, the beta ratio $\beta$ becomes 1.23 according to Equation 2. It is preferable that the NMOS transistor having the same size as the pass transistor is used in the delay inverter of the sense amplifier driver circuit for the period Td to track the change of the period Tbit according to the variations of the manufacturing process, the operating voltage, and the temperature. Accordingly, it is not desirable for a NMOS transistor having the same size as the pass transistor to be used in the delay inverter because transistor formed in a peripheral circuit block typically must be much wider than 0.16 um.

Consequently, the NMOS transistor having the beta ratio $\beta$ the same as that of the pass transistor and having the width and length greater than those of the pass transistor, namely the NMOS transistor having the width of 0.48 um and the length of 0.39 um is used in the delay inverter of the sense amplifier driver circuit. However, since the lengths are different, the driving capacities of the delay inverter in the sense amplifier driver circuit and the pass transistor are different according to variations of the process, the operating voltage, and the temperature, even if the beta ratios are the same. Accordingly, the period Td may not precisely track the change of the period Tbit according to the variations of the process, the operating voltage, and the temperature.

According to some embodiment of the invention, it is preferable that a plurality of NMOS transistors having the same length as the pass transistor are seriesly connected in a pull-down circuit of a sense amplifier driver so that the overall beta ratio $\beta$ of the NMOS transistors to be the same as that of the pass transistor. For example, in the case that three NMOS transistors N91, N92, and N93 are seriesly connected as shown in FIG. 9, it is preferable that the width and length of the NMOS transistors are 0.48 um and 0.13 um, respectively, as obtained from Equation 3.

Figure 12:
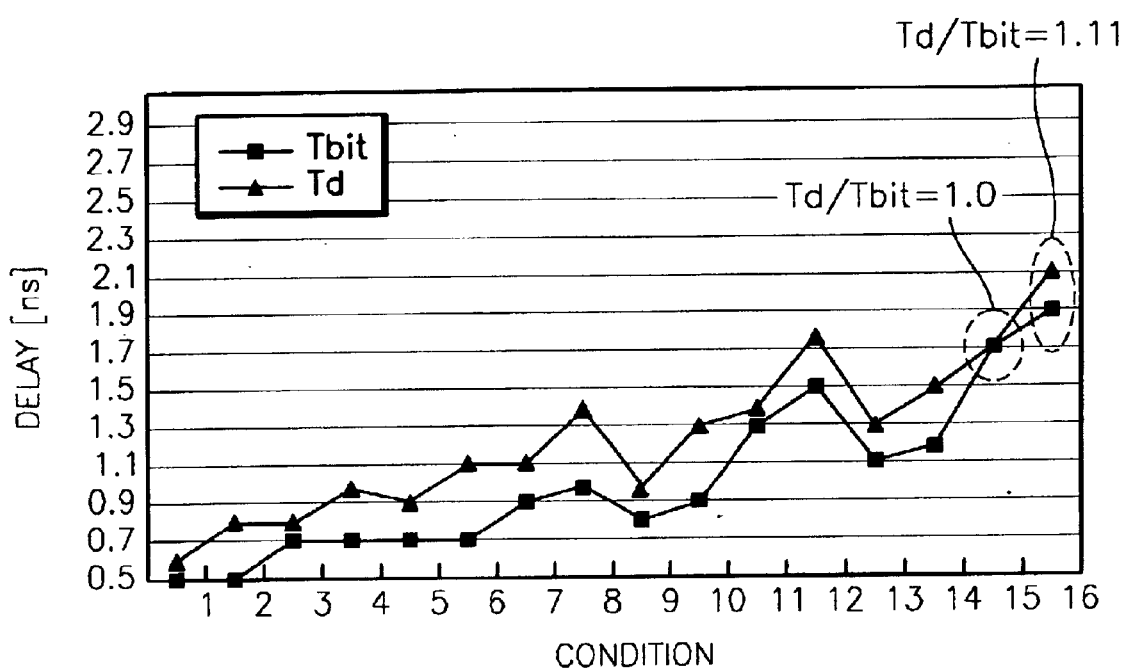
FIG. 12 illustrates simulation results for the delay inverter configuration shown in FIG. 9 according to further embodiments of the present invention.

FIG. 12 is a graph illustrating simulation results showing that the periods Td and Tbit in an SRAM having a sense amplifier driver circuit including a delay inverter configuration as shown in FIG. 9. The working conditions shown in FIG. 7 are used in the simulation of FIG. 12. Referring to FIG. 12, the period Td does not excessively exceed the period Tbit, and the period Td generally closely tracks the change of the period Tbit under a variety of conditions. Especially, under a worst condition 16, the period Td is not excessively longer than the period Tbit. As a result, the speed of the sensing operation in the SRAM having a sense amplifier driver circuit according to some embodiments of the present invention may be faster than the speed of the sensing operation in the SRAM having a conventional sense amplifier driver circuit, which can thereby improve the performance of the SRAM.

Figure 10:
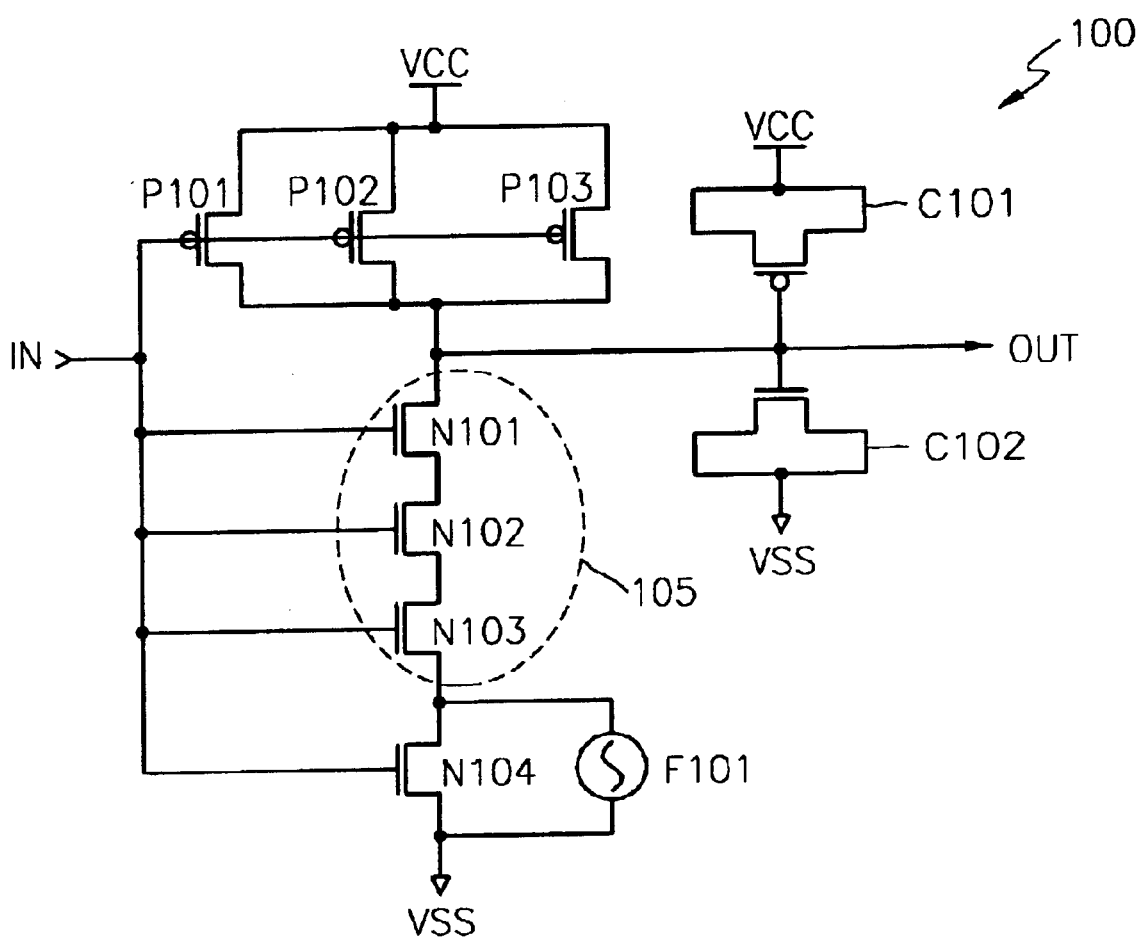
FIG. 10 illustrates a configuration of delay inverters for the sense amplifier driver circuit of FIG. 8 according to further embodiments of the present invention.

FIG. 10 illustrates a delay inverter 100 for the sense amplifier driver circuit of FIG. 8 according to further embodiments of the present invention. The delay inverter 100 includes a pull-down circuit 105 comprising NMOS transistors N101 through N104, PMOS transistors P101 through P103, capacitances C101 and C102, and a fuse F101. The NMOS transistors N101 through N104, the capacitances C101 and C102, and the fuse F101 are the same as the NMOS transistors N91 through N94, the capacitances C91 and C92, and the fuse F91 shown in FIG. 9. The PMOS transistors P101 through P103 are connected between an output OUT and a source voltage VCC in parallel, and the gates of the PMOS transistors P101 through P103 are commonly connected to an input IN.

Figure 11:
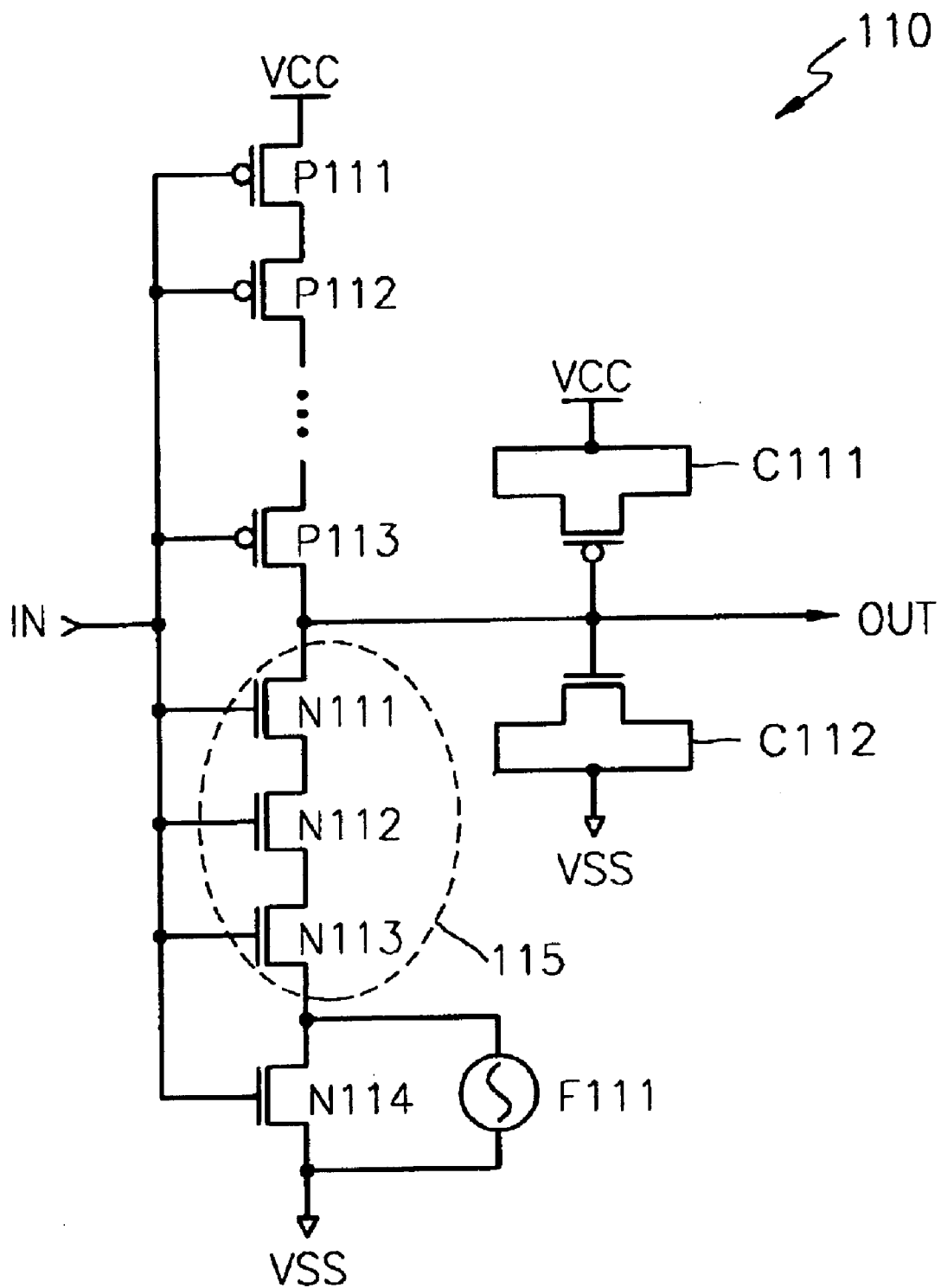
FIG. 11 illustrates a configuration of delay inverters for the sense amplifier driver circuit of FIG. 8 according to still further embodiments of the present invention.

FIG. 11 illustrates a delay inverter 110 for the sense amplifier driver circuit of FIG. 8 according to still further embodiments of the present invention. The delay inverter 110 includes a pull-down circuit 115 including NMOS transistors N111 through N114, PMOS transistors P111 through P113, capacitances C111 and C112, and a fuse F111. The NMOS transistors N111 through N114, the capacitances C111 and C112, and the fuse F111 are the same as the NMOS transistors N91 through N94, the capacitances C91 and C92, and the fuse F91 shown in FIG. 9. The PMOS transistors P111 through P113 are connected between output OUT and a source voltage VCC in series, and the gates of the PMOS transistors P111 through P113 are connected to input IN.

In some embodiments of the present invention, because the sense amplifier driver circuit is formed of a plurality of delay inverters connected in series, the driving performance of the PMOS transistor in the prior delay inverter affects the driving performance of the NMOS transistor in the following delay inverter. Accordingly, the period Td generally tracks the period Tbit by connecting a plurality of PMOS transistors P101 through P103 in parallel as shown in FIG. 10 or by connecting a plurality of PMOS transistors P111 through P113 in series as shown in FIG. 11.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A sense amplifier driver circuit of a semiconductor device for driving a sense amplifier of sensing and amplifying data of a couple of bit lines that are connected to a bit cell, the sense amplifier driver circuit comprising:
   a plurality of delay inverters connected in series,
   wherein at least one delay inverter includes a plurality of NMOS transistors connected to an output in series while having gates connected to an input, and the overall beta ratio (a ratio of width to an entire length of the NMOS transistors) of the NMOS transistors is the same as the beta ratio of a pass transistor in the bit cell.

2. The sense amplifier driver circuit of claim 1, wherein the length of the NMOS transistors is the same as the length of the pass transistor in the bit cell.

3. The sense amplifier driver circuit of claim 2, wherein the width of the NMOS transistors is different from the width of the pass transistor in the bit cell.

4. The sense amplifier driver circuit of claim 1, wherein at least one delay inverter further includes:
   another NMOS transistor connected between one of the NMOS transistors and the ground voltage while having a gate connected to the input; and
   a fuse connected to another NMOS transistor in parallel.

5. The sense amplifier driver circuit of claim 1, wherein at least one delay inverter further includes a PMOS transistor having a drain connected to the output, a gate connected to the input, and a source connected to a source voltage.

6. The sense amplifier driver circuit of claim 1, wherein an internal clock signal generated by an external clock to have a predetermined pulse is input to the input of the first delay inverter of the delay inverters.

7. The sense amplifier driver circuit of claim 1, wherein a sense amplifier driving signal for driving the sense amplifier is output from the output of the last delay inverter of the delay inverters.

8. A sense amplifier driver circuit of a semiconductor memory device for driving a sense amplifier of sensing and amplifying the data of a couple of bit lines that are connected to a bit cell, the sense amplifier driver circuit comprising:
   a plurality of delay inverters connected in series,
   wherein at least one delay inverter includes:
      a plurality of NMOS transistors connected to an output in series while having gates connected to an input; and
      a plurality of PMOS transistors connected to the output in parallel while having gates connected to the input,
      wherein the overall beta ratio of the NMOS transistors is the same as the beta ratio of a pass transistor in the bit cell.

9. The sense amplifier driver circuit of claim 8, wherein the length of the NMOS transistors is the same as the length of the pass transistor in the bit cell.

10. The sense amplifier driver circuit of claim 9, wherein the width of the NMOS transistors is different from the width of the pass transistor in the bit cell.

11. The sense amplifier driver circuit of claim 8, wherein at least one delay inverter further includes:
   another NMOS transistor connected between one of the NMOS transistors and the ground voltage while having a gate connected to the input; and
   a fuse connected to another NMOS transistor in parallel.

12. The sense amplifier driver circuit of claim 8, wherein the sources of the PMOS transistors are connected to the source voltage.

13. The sense amplifier driver circuit of claim 8, wherein an internal clock signal generated by an external clock to have a predetermined pulse is input to the input of the first delay inverter of the delay inverters.

14. The sense amplifier driver circuit of claim 8, wherein a sense amplifier driving signal for driving the sense amplifier is output from the output of the last delay inverter of the delay inverters.

15. A sense amplifier driver circuit of a semiconductor memory device for driving a sense amplifier of sensing and amplifying the data of a couple of bit lines that are connected to a bit cell, the sense amplifier driver circuit comprising:
a plurality of delay inverters connected in series,
wherein at least one delay inverter includes:
a plurality of NMOS transistors connected to an output in series while having gates connected to an input; and
a plurality of PMOS transistors connected to the output in series while having gates connected to the input, wherein the overall beta ratio of the NMOS transistors is the same as the beta ratio of a pass transistor in the bit cell.

16. The sense amplifier driver circuit of claim 15, wherein the length of the NMOS transistors is the same as the length of the pass transistor in the bit cell.

17. The sense amplifier driver circuit of claim 16, wherein the width of the NMOS transistors is different from the width of the pass transistor in the bit cell.

18. The sense amplifier driver circuit of claim 15, wherein at least one delay inverter further includes:
another NMOS transistor connected between one of the NMOS transistors and the ground voltage while having a gate connected to the input; and
a fuse connected to another NMOS transistor in parallel.

19. The sense amplifier driver circuit of claim 15, wherein one source of the PMOS transistors is connected to the source voltage.

20. The sense amplifier driver circuit of claim 15, wherein an internal clock signal generated by an external clock to have a predetermined pulse is input to the input of the first delay inverter of the delay inverters.

21. The sense amplifier driver circuit of claim 15, wherein a sense amplifier driving signal for driving the sense amplifier is output from the output of the last delay inverter of the delay inverters.

22. A sense amplifier driver circuit for generating a sense amplifier enable signal that enables a sense amplifier that drives a bit line coupled to a pass transistor of a memory cell, the sense amplifier driver circuit comprising:
an inverter that generates the sense amplifier enable signal, the inverter comprising a pull-down circuit comprising a plurality of series-connected MOS transistors of the same conductivity type as the pass transistor, wherein the plurality of series-connected MOS transistors has an overall channel width/length ratio that is substantially the same as a channel width/length ratio of the pass transistor.

23. A sense amplifier driver circuit according to claim 22, wherein an aggregate length of the series-connected transistors is substantially the same as a length of the pass transistor.

24. A sense amplifier driver circuit according to claim 23, wherein widths of the series-connected transistors are different from a width of the pass transistor.

25. A sense amplifier driver circuit for generating a sense amplifier enable signal that enables a sense amplifier that drives a bit line coupled to a pass transistor of a memory cell, the sense amplifier driver circuit comprising:
an inverter that generates the sense amplifier enable signal, the inverter comprising a pull-down circuit comprising a plurality of series-connected MOS transistors of the same conductivity type as the pass transistor, wherein the inverter comprises:
at least one PMOS transistor having a source electrode coupled to a first power supply node;
a series-connected plurality of NMOS transistors coupled between a drain electrode of the at least one PMOS transistor and a second power supply node,
wherein gate electrodes of the at least one PMOS transistor and the NMOS transistors are commonly connected.

26. A sense amplifier driver circuit according to claim 25, wherein the inverter further comprises a fuse connected in parallel with at least one of the series-connected NMOS transistors.

27. A sense amplifier driver circuit for generating a sense amplifier enable signal that enables a sense amplifier that drives a bit line coupled to a pass transistor of a memory cell, the sense amplifier driver circuit comprising:
an inverter that generates the sense amplifier enable signal, the inverter comprising a pull-down circuit comprising a plurality of series-connected MOS transistors of the same conductivity type as the pass transistor, wherein the inverter comprises:
a PMOS transistor having a source electrode coupled to a first power supply node;
a series-connected plurality of NMOS transistors coupled between a drain electrode of the PMOS transistor and a second power supply node,
wherein gate electrodes of the PMOS transistor and the NMOS transistors are commonly connected.

28. A sense amplifier driver circuit for generating a sense amplifier enable signal that enables a sense amplifier that drives a bit line coupled to a pass transistor of a memory cell, the sense amplifier driver circuit comprising:
an inverter that generates the sense amplifier enable signal, the inverter comprising a pull-down circuit comprising a plurality of series-connected MOS transistors of the same conductivity type as the pass transistor, wherein the inverter comprises:
a plurality of PMOS transistors having source electrodes coupled in common to a first power supply node;
a series-connected plurality of NMOS transistors coupled between commonly connected drain electrodes of the PMOS transistors and a second power supply node,
wherein gate electrodes of the PMOS transistors and the NMOS transistors are commonly connected.

29. A sense amplifier driver circuit for generating a sense amplifier enable signal that enables a sense amplifier that drives a bit line coupled to a pass transistor of a memory cell, the sense amplifier driver circuit comprising:
an inverter that generates the sense amplifier enable signal, the inverter comprising a pull-down circuit comprising a plurality of series-connected MOS transistors of the same conductivity type as the pass transistor, wherein the inverter comprises:
a series-connected plurality of PMOS transistors having a source electrode coupled to a first power supply node;
a series-connected plurality of NMOS transistors coupled between a drain electrode of the series-connected PMOS transistors and a second power supply node,
wherein gate electrodes of the PMOS transistors and the NMOS transistors are commonly connected.

* * * * *